United States Patent
Lorenz et al.

(10) Patent No.: US 7,131,105 B2
(45) Date of Patent: Oct. 31, 2006

(54) SYSTEM AND METHOD FOR AUTOMATIC MESH GENERATION FROM A SYSTEM-LEVEL MEMS DESIGN

(75) Inventors: Gunar Lorenz, St. Remy les Chevreuse (FR); Christopher J. Kennedy, Apex, NC (US)

(73) Assignee: Coventor, Inc., Cary, NC (US)

( * ) Notice: Subject to any disclaimer, the term of this patent is extended or adjusted under 35 U.S.C. 154(b) by 318 days.

(21) Appl. No.: 10/665,885

(22) Filed: Sep. 19, 2003

(65) Prior Publication Data

US 2005/0066301 A1    Mar. 24, 2005

(51) Int. Cl.
*G06F 17/50* (2006.01)
*G06F 7/60* (2006.01)

(52) U.S. Cl. .............................. 716/20; 716/19; 703/2
(58) Field of Classification Search .................. 716/2, 716/5, 19, 20; 703/2, 10, 11; 345/423; 424/423
See application file for complete search history.

(56) References Cited

U.S. PATENT DOCUMENTS

| | | | | |
|---|---|---|---|---|
| 5,265,040 A | * | 11/1993 | Saji et al. ...................... | 716/20 |
| 5,587,922 A | * | 12/1996 | Hendrickson et al. ......... | 716/2 |
| 6,116,766 A | * | 9/2000 | Maseeh et al. ................ | 700/97 |
| 6,121,973 A | * | 9/2000 | Itoh et al. ..................... | 345/423 |
| 6,178,544 B1 | * | 1/2001 | Syo ............................ | 716/20 |
| 6,219,440 B1 | * | 4/2001 | Schaff et al. ................ | 382/128 |
| 6,259,453 B1 | * | 7/2001 | Itoh et al. ..................... | 345/423 |
| 6,317,704 B1 | * | 11/2001 | Furuhata et al. ............... | 703/2 |
| 6,665,849 B1 | * | 12/2003 | Meuris et al. ................. | 716/7 |
| 6,708,141 B1 | * | 3/2004 | Schaff et al. ................. | 703/2 |
| 6,718,291 B1 | * | 4/2004 | Shapiro et al. ................ | 703/2 |
| 2002/0120906 A1 | * | 8/2002 | Xia et al. ...................... | 716/2 |
| 2004/0062786 A1 | * | 4/2004 | Ascenzi et al. .............. | 424/423 |
| 2004/0117163 A1 | * | 6/2004 | Rivara .......................... | 703/2 |
| 2005/0086628 A1 | * | 4/2005 | Filippi et al. ................. | 716/20 |
| 2005/0131662 A1 | * | 6/2005 | Ascenzi et al. ............... | 703/11 |

OTHER PUBLICATIONS

Bächtold et al., "An error indicator and automatic adaptive meshing for electrostatic boundary element simulations", Dec. 1997, Transactions on vol. 16, Issue 12, pp. 1439-1446.*

(Continued)

*Primary Examiner*—A. M. Thompson
*Assistant Examiner*—Helen Rossoshek
(74) *Attorney, Agent, or Firm*—Lahive & Cockfield, LLP (57) ABSTRACT

A mesh generation tool that is programmatically integrated with a system-level design and simulation environment, thereby enabling the direct generation of PDE solver input from a system-level design and simulation environment and a method for using the mesh generation tool are disclosed. Automatic mesh generation and optimization is improved by making available additional information about the nature and purpose of certain design components to the mesh generation tool. Specifically, the parameters of the components in the device schematic, which represent a user-defined decomposition of a larger MEMS design into smaller entities of clear physical purpose, are made available to the mesh generation tool. The link established between the system-level design and PDE analyses allows the user to move between the two levels of abstraction. The mesh generation tool retrieves information from the components and connectors of a schematic of a MEMS device, and produces a discrete element model suitable for numerical PDE analysis by the finite element (FEM) and boundary element (BEM) methods. A direct link from a schematic model to a mesh model helps the user to produce an optimal mesh for PDE analysis, thereby avoiding considerable unnecessary computation.

59 Claims, 7 Drawing Sheets

OTHER PUBLICATIONS

Hung et al., "Low-order models for fast dynamical simulation of MEMS microstructures", Jun. 16-19, 1997, Solid State Sensors and Actuators, TRANSDUCERS '97, International Conference on, vol. 2, pp. 1101-1104 vol. 2 ☐☐.*

Senturia et al., "Simulating the behavior of MEMS devices: computational methods and needs", Jan.-Mar. 1997, Science & Engineering], vol. 4, Issue 1, pp. 30-43 ☐☐.*

Aluru et al., "A point collocation method for meshless analysis of microelectronic and microelectromechanical devices", Oct. 19-21, 1998. Computational Electronics, IWCE-6. Extended Abstracts of 1998 Sixth International Workshop on, pp. 54-57.*

Gilbert et al., "Implementation of MEMCAD system for electrostatic and mechanical analysis of complex structures from mask descriptions", Feb. 7-10, 1993, Micro Electro Mechanical Systems, Proceedings 'pp. 207-212.*

Bochobza et al., An efficient relaxation based DIPIE algorithm for computer aided design of electrostatic actuators, Jan. 20-24, 2002, The Fifteenth IEEE International Conference on, pp. 200-203.*

Bochobza et al., , "An efficient DIPIE algorithm for CAD of electrostatically actuated MEMS devices", Oct. 2002, Microelectromechanical Systems, Journal of, vol. 11, Issue 5, pp. 612-620.*

Tanaka et al., "Adaptive mesh generation in three dimensional device simulation", Jun. 5-6, 1994, Numerical Modeling of Processes and Devices for Integrated Circuits, NUPAD V., International Workshop on, pp. 163-166.*

* cited by examiner

SYSTEM AND METHOD FOR AUTOMATIC MESH GENERATION FROM A SYSTEM-LEVEL MEMS DESIGN

FIELD OF THE INVENTION

The illustrative embodiment of the present invention relates generally to Computer Aided Design (CAD) and more particularly to automatic mesh generation from a system-level design and simulation environment thereby making it easier to verify approximations made in a schematic-driven Micro Electro-Mechanical Systems (MEMS) design with detailed 3D numerical analysis of the governing partial differential equations (PDEs).

BACKGROUND

Computer Aided Design (CAD) systems are used to design and simulate virtual models of electrical, electronic or mechanical devices prior to producing actual physical devices. CAD systems are interactive software tools that run on a digital computer with a graphical display device. In particular, micro-fabricated devices such as electronic integrated circuits (ICs) and Micro Electro-Mechanical Systems (MEMS) can be designed and simulated using CAD systems prior to beginning the costly and time-consuming process of fabricating actual physical devices.

MEMS are micro or nano-scale devices typically fabricated in a similar fashion as integrated circuits (ICs) to exploit the miniaturization, integration, and batch processing attainable with semiconductor manufacturing processes. Unlike ICs which consist solely of electrical components, MEMS devices combine components from multiple physical domains and may contain, for example, electrical, mechanical, and fluidic components. MEMS devices appear in many forms and may include micro-electromechanical sensors and actuators such as gyroscopes, accelerometers, and pressure sensors, micro-fluidic devices such as ink jet heads, Radio-Frequency (RF) devices such as switches, resonators and passives, and optical devices such as micro-mirrors and fiber alignment devices.

The behavior of both MEMS and IC devices can be modeled at the system level as an interconnected network of simpler components. The MEMS device is represented by a network of components such as mechanical beams, plates, electrodes, magnetic coils etc. Each component has an underlying mathematical description, or behavioral model, which is referred to herein as a component model. Typically, these component models are parameterized, i.e. they take as input a few parameters such as width and height, so that the same mathematical model can be used for different versions of the same type of component. For example, a single component may be used to generate models for different dimensions. A system-level simulator numerically computes, or simulates, the collective behavior of the network of component models.

Two commonly used methods of describing a system-level simulation are circuit simulation and signal-flow simulation. A system-level design is captured graphically in a circuit schematic or in a signal-flow diagram, and then its behavior is simulated by, respectively, a circuit simulator or a signal-flow simulator. Traditionally, circuit simulation has been used for electronic circuit design while signal-flow simulation has been used for control system and signal processing design. Currently, both types of system-level simulation are used to simulate not only ICs, but also multi-physics devices such as MEMS.

Schematic driven MEMS simulations, while very useful for initial design purposes, involve approximations that must be verified by detailed 3D numerical analysis of the governing PDEs. Numerical PDE solvers take as input a discrete element model that consists of a mesh representation of the device geometry and some constraints such as boundary conditions or initial conditions. Typically, a user creates the mesh representation by subdividing the geometric shapes that comprise the device into smaller, simpler shapes called elements. The elements are called finite elements if they represent a portion of a 3D solid, or boundary elements if they represent a portion of a surface that encloses a 3D solid. A set of elements that collectively represents an entire device is known as a mesh. Numerical PDE solvers, which may be based on the finite element method (FEM), boundary element method (BEM), or a hybrid of the two, are used to obtain detailed, 3D solution fields such as displacement, stress, and electrostatic charge distribution, and integral quantities such as the resonant frequency, damping force, and total capacitance. Abaqus from Abaqus, Inc. of Pawtucket, R.I. and Ansys from Ansys, Inc. of Canonsburg, Pa. are examples of two commercially available finite element solvers. CoventorWare from Coventor, Inc. of Cary, N.C., is an example of commercially available software that exploits a hybrid FEM/BEM approach to numerically solve the PDEs that describe coupled electromechanics effects in MEMS devices.

Conventional CAD systems allow a user to specify the mesh characteristics, run a mesh generation procedure, and finally run a numerical PDE simulation. Unfortunately, the process of preparing a mesh in conventional CAD systems has several drawbacks. Numerical PDE analysis tends to be very resource intensive from a computer standpoint, requiring considerable memory and processing time. The resource requirements and the quality of the numerical simulation depend largely on the type of finite elements used and the mesh density (level of solid model discretization). Various finite element types, such as tetrahedral, hexahedral, brick, shell and beam elements, are available. Each element type has strengths and weaknesses in its ability to conform to certain geometric shapes, the amount of computational effort required, and accuracy. Using too fine a mesh or inappropriate element types can easily lead to impractically large memory and simulation time requirements. For example, long thin tethers that are typical of MEMS devices can be most efficiently modeled by beam elements as opposed to hexahedral or tetrahedral elements. Likewise, thin plate-like structures that have many perforations can be most efficiently modeled by a collection of interconnected beam elements.

The choice of element type in preparing a model for meshing may be left to the user, who must apply considerable subjective judgment. Alternatively, an automatic mesh generation algorithm may automatically attempt to choose the most appropriate element type for a mesh. Unfortunately, automatic algorithms require an extensive set of heuristics and therefore are inherently unreliable since they are not aware of the purpose and shape of sub-structures within the design and are unable to choose the optimal element type and local mesh density.

SUMMARY OF THE INVENTION

The illustrative embodiment of the present invention provides a mesh generation tool that is programmatically integrated with a system-level design and simulation environment, thereby enabling the direct generation of PDE solver input from a system-level design and simulation environment. Automatic mesh generation and optimization is improved by making available additional information about the nature and purpose of certain design components to the mesh generation tool. Specifically, the parameters of the components in the device schematic, which represent a user-defined decomposition of a larger MEMS design into smaller entities of clear physical purpose, are made available to the mesh generation tool. The link established between the system-level design and PDE analyses allows the user to rapidly and efficiently move between these two levels of abstraction. The mesh generation tool retrieves information from the components and connectors of a schematic of a MEMS device, and produces a discrete element model suitable for numerical PDE analysis by the finite element (FEM) and boundary element (BEM) methods. A direct link from a schematic model to a mesh model helps the user to produce an optimal mesh for PDE analysis, thereby avoiding considerable unnecessary computation.

In one embodiment, in a CAD environment, a method of automatic mesh generation includes the step of composing a schematic MEMS design, the schematic MEMS design including a number of components with each of the components being associated with a mesh generator. The mesh generators are computer instructions describing how to create a mesh for the associated component. The method also includes the step of providing a mesh generation tool that uses the mesh generators to generate a mesh for the MEMS device that is the subject of the schematic MEMS design, or a user-defined sub-assembly. The method uses at least one generated mesh as input for a numerical PDE solver in a simulation environment, the PDE solver verifying approximations made in the MEMS design.

In another embodiment, in a design environment, a method of automatic mesh generation includes the step of creating a schematic design, the schematic design including a number of components with each of the components being associated with a mesh generator. The mesh generators are computer instructions describing how to create a mesh for the associated components. The method also includes the step of providing a mesh generation tool which uses the mesh generators to generate a mesh for the device that is the subject of the schematic design, or a user-defined sub-assembly. The method uses the generated mesh as input for a solver in a simulation environment, the solver verifying approximations made in the design.

In a different embodiment, in a CAD environment, a method of automatic mesh generation includes the step of providing a schematic MEMS design, the schematic MEMS design including a number of components with each of the components being associated with a mesh generator. The mesh generators are computer instructions describing how to create a mesh for the associated component. The method also includes the step of providing a mesh generation tool which uses the mesh generators to generate a mesh for the MEMS device that is the subject of the schematic MEMS design, or a user-defined sub-assembly. The method uses at least one generated mesh as input for a numerical PDE solver in a simulation environment, the PDE solver verifying approximations made in the MEMS design.

In an embodiment in a CAD environment, a system includes a schematic MEMS design suitable for system-level simulations. The schematic MEMS design includes multiple components, with each component being associated with a mesh generator. The mesh generator is a set of computer instructions describing how to create a mesh for the associated component. The system also includes a mesh generation tool which uses the multiple mesh generators to create a single mesh made up of smaller meshes for either the MEMS device being modeled or a user-defined sub-assembly of the MEMS device. The system also includes a numerical PDE solver which uses the generated mesh as input to verify approximations made in the system-level simulations of the MEMS design.

DETAILED DESCRIPTION

The illustrative embodiment of the present invention enables a user to create a schematic design, such as a MEMS design, which includes multiple components. Each component is associated with a mesh generator. Each mesh generator is a set of computer instructions describing how to create a mesh for the associated component. A mesh generation tool is utilized to access the multiple mesh generators to create a mesh representing either a device, or a sub-assembly of a device that is being modeled. The mesh is used as input to a solver, such as a numerical PDE solver, in a simulation environment. The direct use of the schematic avoids the loss of data that would follow from generating the mesh from a 2D mask layout or 3D solid model derived from the schematic.

Figure 1A:
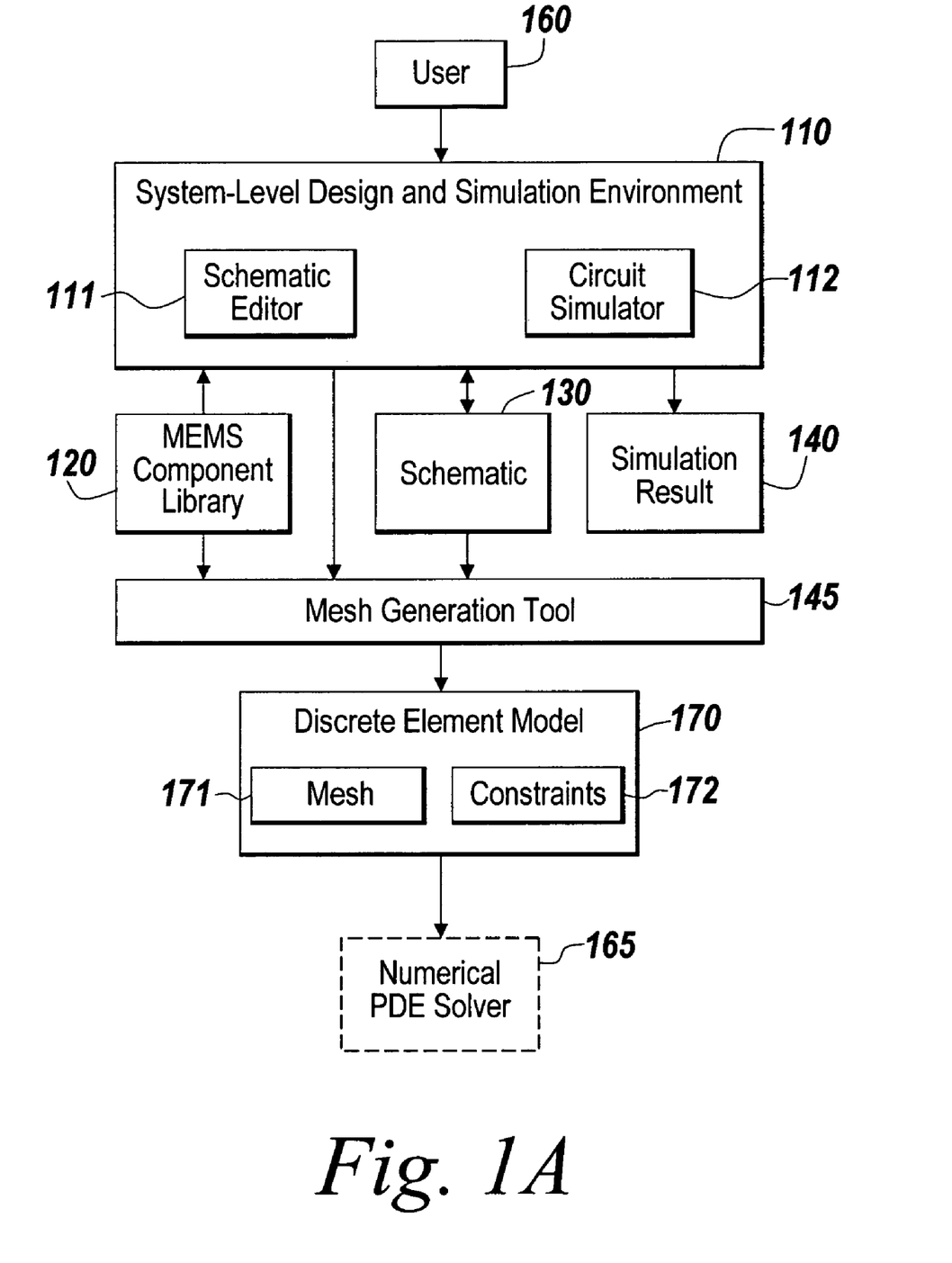
FIG. 1A depicts an environment suitable for practicing the illustrative embodiment of the present invention.

FIG. 1A depicts a block diagram of an environment suitable for practicing the illustrative embodiment of the present invention. A user 160 interfaces with a System-Level Design and Simulation Environment 110 that includes a schematic editor 111, and a circuit simulator 112. The System-Level Design and Simulation Environment 110 allows a user 160 to digitally compose a MEMS schematic using a graphical interface. The schematic editor 111 is utilized by the user 160 to compose a schematic 130, and is interfaced with a MEMS component library 120. The User 160 is able to choose various components from the MEMS component library 120 for inclusion in the schematic 130. The user 160 may also view a simulation result 140 from the circuit simulator 112.

When detailed 3D numerical simulations are required, the mesh generation tool 145 is used to generate a discrete-element model 170 for input to a numerical PDE solver 165. The system-level design and simulation environment 110 and the mesh generation tool 145 both have access to the information stored in the MEMS component library 120 and the schematic 130. The mesh generation tool 145 uses the information from the MEMS component library 120 and the schematic 130 to create the discrete-element model 170. The discrete element model 170 includes a mesh 171 and constraints 172. The constraints 172 include boundary conditions and initial conditions. The discrete element model is used as input into a numerical PDE solver 171. The numerical PDE solver 171 is used to verify approximations made in the design of the schematic by running numerical analysis of the created model in view of the data contained in the generated mesh.

Figure 1B:
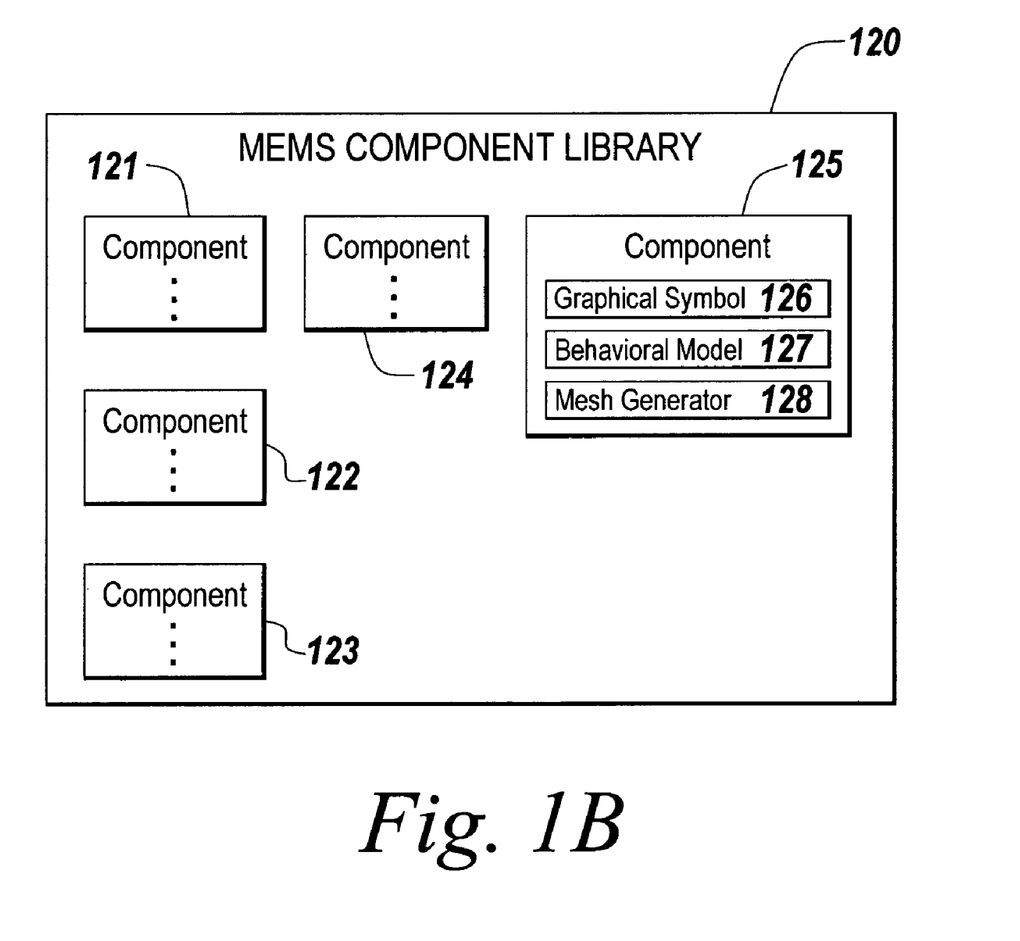
FIG. 1B depicts the contents of the model component library of FIG. 1A.

FIG. 1B depicts the contents of the MEMS component library 120. The MEMS component library 120 includes a plurality of components, 121, 122, 123, 124 and 125. Each component 121–125 includes a graphical symbol 126 that can be displayed in the schematic editor 111, a behavioral model 127, and a "mesh generator" 128. The behavioral model 127 describe mathematically how the individual components behave when subjected to electrical or mechanical stimuli, or stimuli from other types of physical effects such as electrostatic, magnetic, thermal, electrothermal, piezoelectric, piezo-resistive, fluid damping and electromagnetic effects. The circuit simulator 112 uses the behavioral models 127 to simulate the collective behavior of the MEMS device. The mesh generators 128 are computer scripts or procedures that describe how to create finite element and/or boundary element meshes that represent the individual components. The mesh generation tool 145 uses the mesh generators 128 to generate a finite element and/or boundary element mesh 171 that represents the entire MEMS device, or a user-defined sub-assembly.

Figure 2:
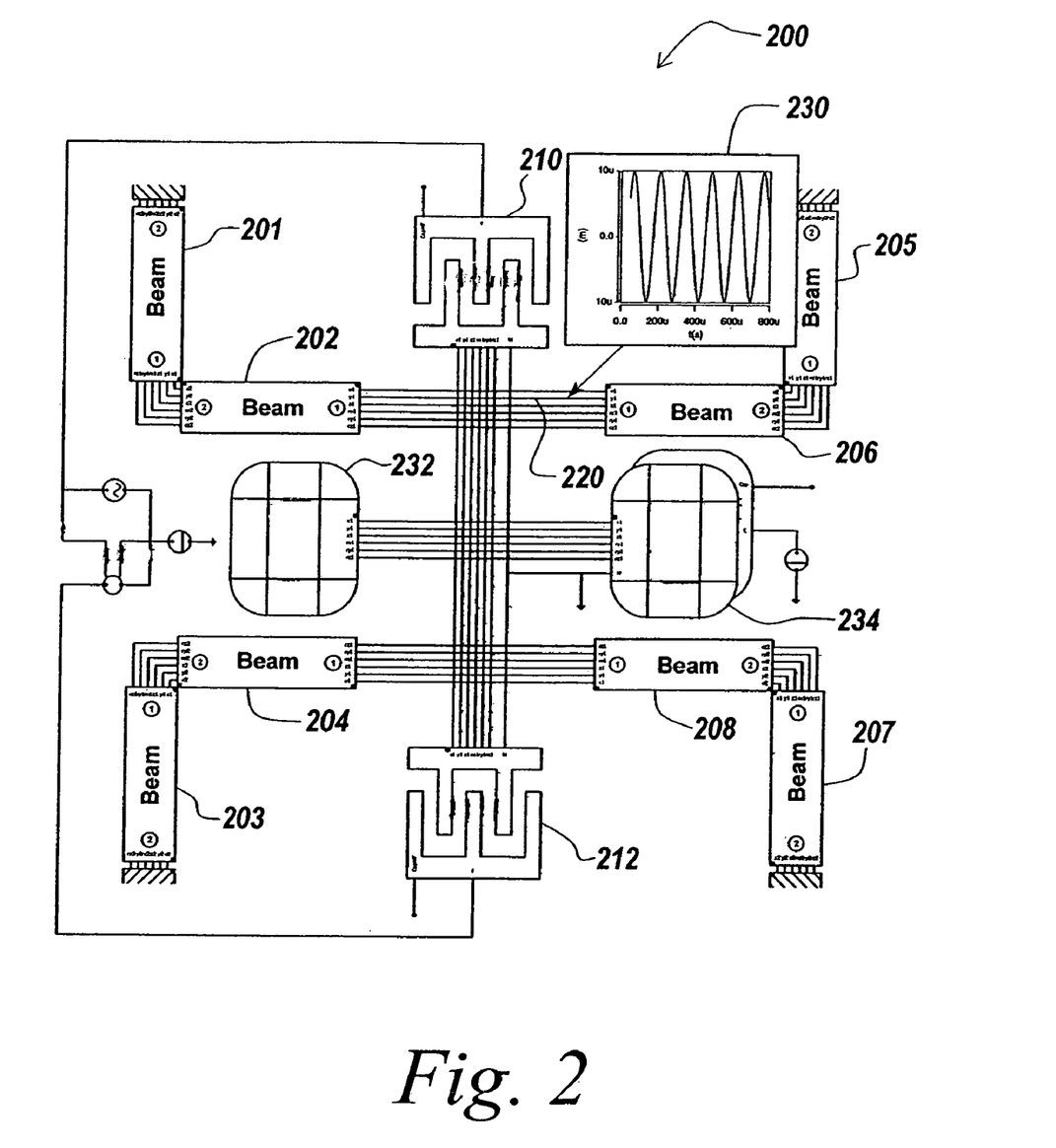
FIG. 2 depicts a schematic of a MEMS device (a gyroscope) including beams, a plate, an electrode and comb structures.
Figure 3:
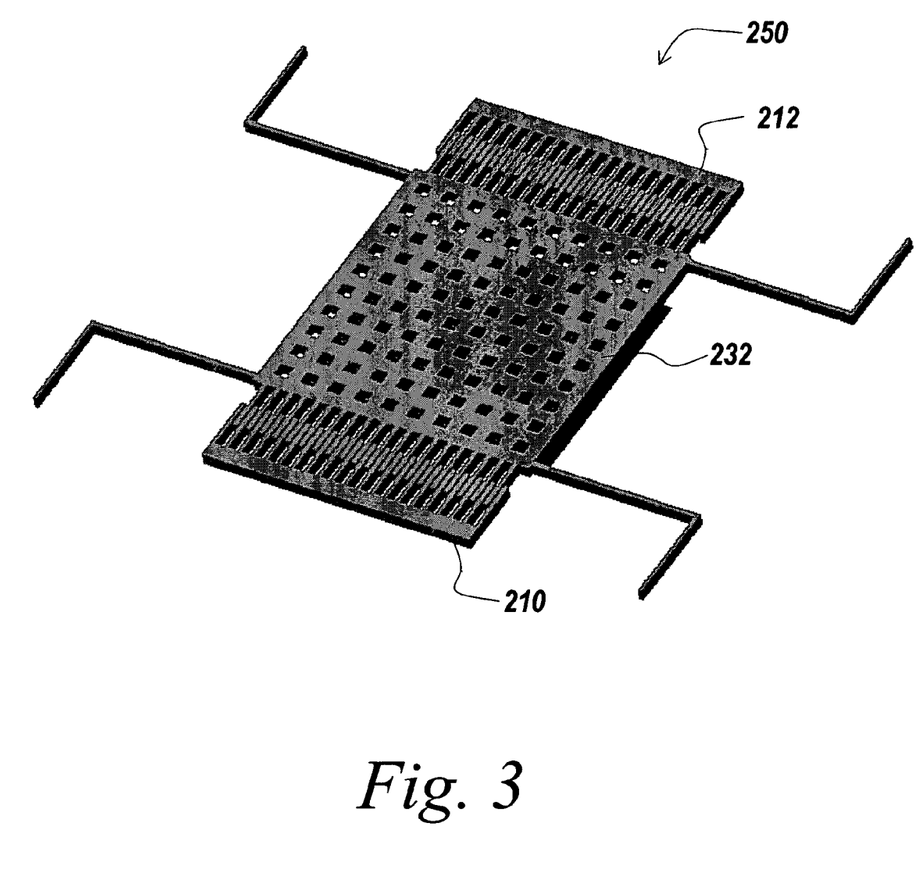
FIG. 3 depicts a 3D graphical view of the MEMS device represented by the schematic in FIG. 2.

In the illustrative embodiment of the present invention, a schematic of a MEMS device is composed in a schematic editor by selecting, placing and connecting component symbols. FIG. 2 depicts the result of the schematic composition process. Procedurally, the user 160 selects the desired components 121–125 from the MEMS component library 120, configures the parameters of the components, and interconnects their ports to create a schematic 200 of the entire device. The schematic 200 includes multiple beams 201–208, combs 210 and 212, a rigid plate 232, and an electrode 234. The "X-Y plot" in the upper right corner 230 shows the simulated transient motion for one of the mechanical degrees of freedom 220 (represented in the schematic as a wire). The schematic 200 may be used to generate an image 250 as depicted in FIG. 3 which includes realistic representations of the combs 210 and 212, and the rigid plate 232.

The procedure used to compose the schematic 200 is analogous to integrated circuit capture, where symbols representing electronic components such as transistors, resistors, inductors and capacitors are connected to create the desired circuit behavior. The symbols that represent the electronic components have ports, or pins, that can be connected by wires to pins on other components. Each pin has a voltage and transfers current into or out of the component. However, in the case of MEMS schematic capture, the components represent entities from other physical domains instead of the electronic components. Components in MEMS schematic capture include structural beams and plates, magnets, electrostatic comb structures and electrodes. The ports on MEMS component symbols represent inputs for electrical, mechanical or magnetic sources, or mechanical degrees of freedom (translational and rotational motions). For the mechanical components, force rather than current is transferred on the wires between pin connections.

Figure 4:
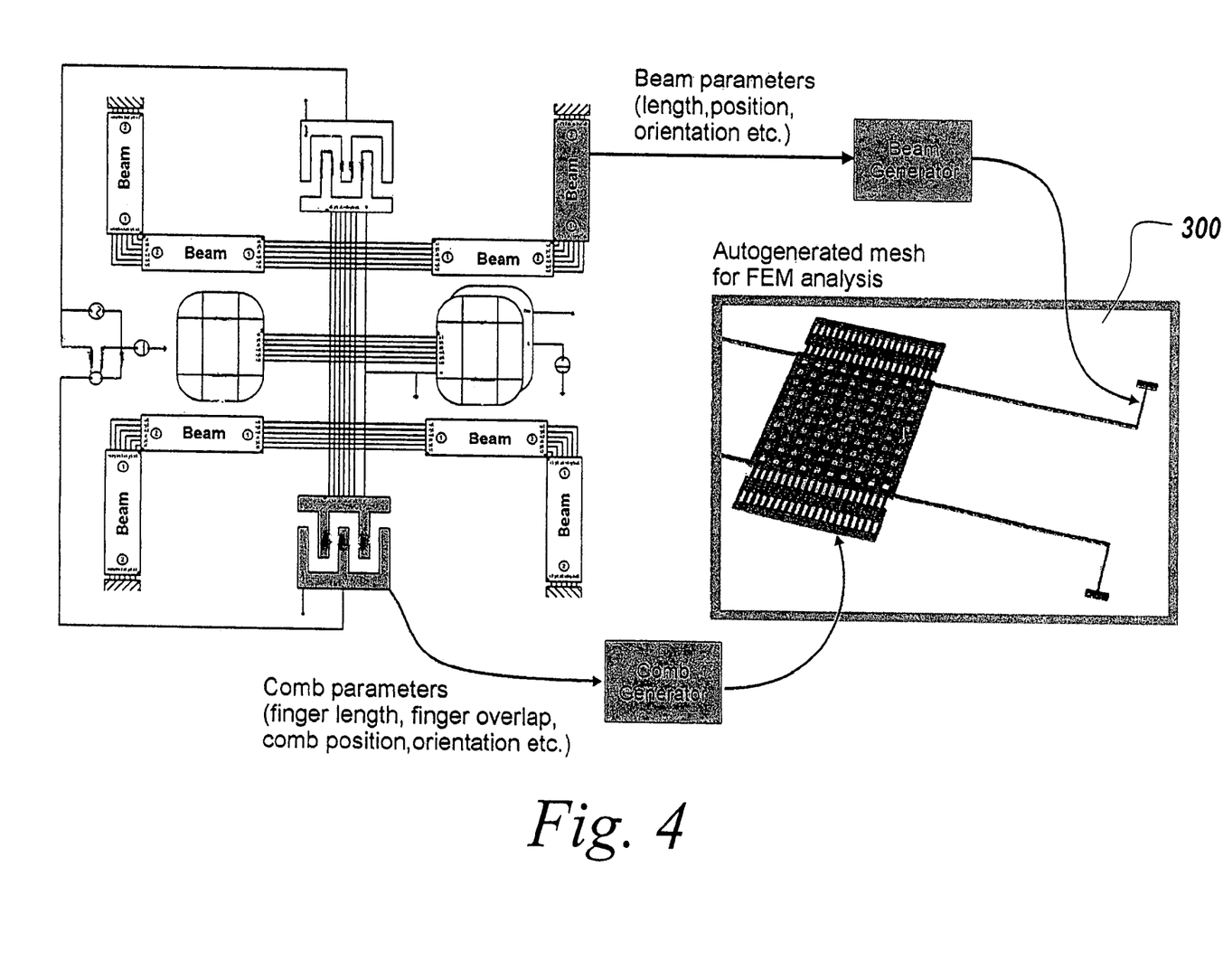
FIG. 4 depicts a finite element mesh that was automatically generated from the schematic in FIG. 1. Each component in the schematic has a corresponding mesh generator that creates a local mesh based on the geometrical parameters received from the schematic symbol.

To obtain a discrete-element model, a user selects a group of components in the schematic using the graphical interface into the System Level Design and Simulation Environment 110. The group may be a subset corresponding to a sub-assembly or it may include all of the displayed components. Each selected component has a corresponding mesh generator. The behavioral model and the mesh generator associated with each component share the same parameters, such as position, orientation, length, width and height. The generator itself is a procedure that uses the parameter information (possibly together with other design information such as the fabrication process description and material properties, etc.) to create a mesh representation of the corresponding component. By way of illustration, the comb component 212 in the schematic 200 may be selected and the associated comb generator used to create an auto-generated mesh of the comb 300 suitable for FEM analysis as depicted in FIG. 4. The comb parameters used may include finger length, finger overlap, comb position, orientation and other parameters. The parameters are stored as data in the previously created schematic in the System Level Design and Simulation Environment 110.

Each mesh generator may produce one or more kinds of mesh representations of the component, according to the user's preference and the requirements of the numerical PDE solver. A beam component, for example, may be decomposed by sub-dividing the beam along it's centerline into multiple segments, each being represented by a "beam element". Similarly, a rectangular plate component may be decomposed into smaller rectangular regions, each being represented by a "shell element". The table below shows examples of mechanical components in the MEMS component library and their corresponding finite-element representations:

| MEMS library component | Finite-element representation |
| --- | --- |
| Beam | Beam element(s) |
| Rectangular plate | Shell element(s) |
| Rectangular plate with lattice of rectangular perforations. | Array of beam finite elements |
| Triangular plate | Shell element(s) |
| Triangular plate with lattice of rectangular perforations | Array of beam finite elements |
| Electrostatic comb with straight, curved, or radial fingers. | Beam elements |

It should be noted that the mesh generators may be customized to generate many types of elements: solid tetrahedral or hexahedral elements, shell elements, beam elements, or combinations thereof. Those skilled in the art will recognize that the MEMS component library is not limited to the examples depicted above.

The mesh generation tool 145 generates a mesh in two phases. In the first phase, the mesh generation tool 145 obtains a list of the selected components. Once the list of selected components have been obtained, the mesh generation tool 145 invokes the mesh generator for each component to produce a "stand-alone" mesh for the component. In the second phase of the process, the mesh generation tool 145 "knits together" the stand-alone meshes using the connectivity information that is indicated by the wires between components in the schematic. Wires that are associated with mechanical degrees of freedom (translation and rotation)

imply mechanical connectivity, but not necessarily geometric connectivity. That is, there may be overlaps or gaps between the geometric shapes of mechanically connected components. Despite the alignment issues however, the mesh generation tool 145 is expected to produce a mesh between mechanically connected components that is geometrically connected and conforming. A mesh is considered to be conforming if the intersection of any two elements in the mesh reduces only to the empty set, or a common vertex, a common edge, or a common face. The mesh generation tool 145 employs a number of algorithms for connecting the individual meshes together to produce a conforming mesh. The choice of algorithm depends on the type of components being connected, the type of mesh elements in the individual meshes and, in some cases, preferences specified by the user. The mesh generation tool contains logic that determines the optimal method of connecting the mesh representations of the individual components.

Figure 5:
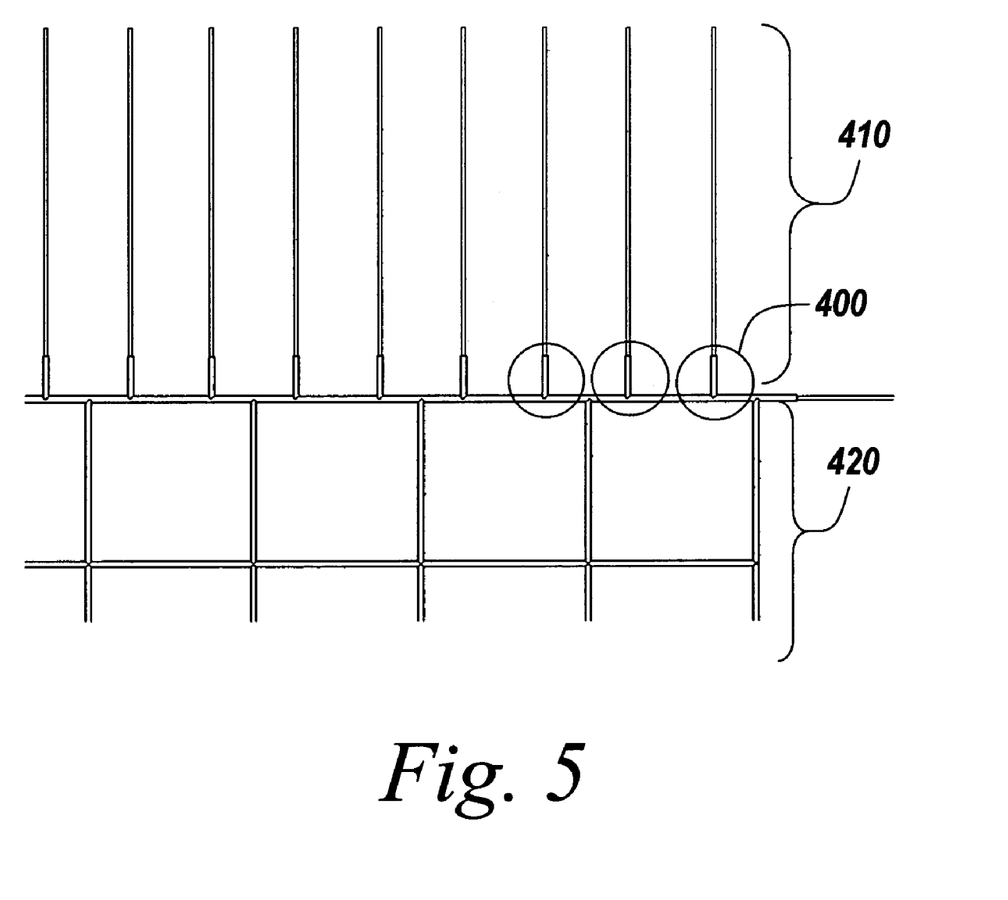
FIG. 5 depicts a mesh representation of an electrostatic comb combined with the mesh representation of a perforated rectangular plate.

For example, a beam component can be connected to one or more adjacent beam components. If the mesh representations of the beam components consist of beam elements, the individual component meshes may be connected by inserting a single beam element or an array of beam elements that join the end node of the first beam component to mesh nodes belonging to one or more adjacent beam components. As another example, depicted in FIG. 5, a comb component 410 that has a mesh representation consisting of beam elements may be connected to a perforated plate component 420 that has a mesh representation consisting of a grid of beam elements. In this case, the beam elements representing the two adjacent components are connected based on the proximity of the mesh nodes. Beam elements that have under-constrained end nodes, that is end nodes that are not shared by other beam elements or otherwise constrained, are evaluated for their proximity to the mesh nodes on other mechanically connected components. Since an under-constrained end node may not coincide exactly with a node on an adjacent component (this is more often the case than not), the mesh on the boundary of the adjacent component must be modified to accept the connection from the beam end node. This is accomplished by decomposing one or more of the beam elements on the boundary of the adjacent component, i.e. replacing a single element with two or more elements. Alternatively, or sometimes in combination, an additional beam element may be added to the mesh to connect the under-constrained end node with the mesh on an adjacent component. A connection 400 between non-coinciding adjacent component meshes, established through decomposition, is depicted in FIG. 5.

The wires in the schematic may also contain information regarding the boundary conditions that are to be imposed in a simulation of the device, whether by a circuit simulator or a numerical PDE solver. For example, the points where the moving parts of a MEMS device are connected to the silicon substrate are referred to as anchor points. A rigid or immovable boundary condition is typically applied at these anchor points, and may be specified automatically in the discrete element model. Other locations in the schematic can also have constraints applied, and likewise these can be specified automatically in the discrete element model in the form of boundary or initial conditions.

In certain situations, the automatic detection and generation of connectivity is not possible. The mesh generation tool collects these locations and presents a report to the user to show places (either components or wires or both) in the schematic design where corrections may be required, or the specifics of the design prevented the mesh generation tool from finding a unique solution. Errors are highlighted by schematic component and/or wire selections and detailed error messages. The user can customize the mesh generators in order to address specific geometrical requirements.

Figure 6:
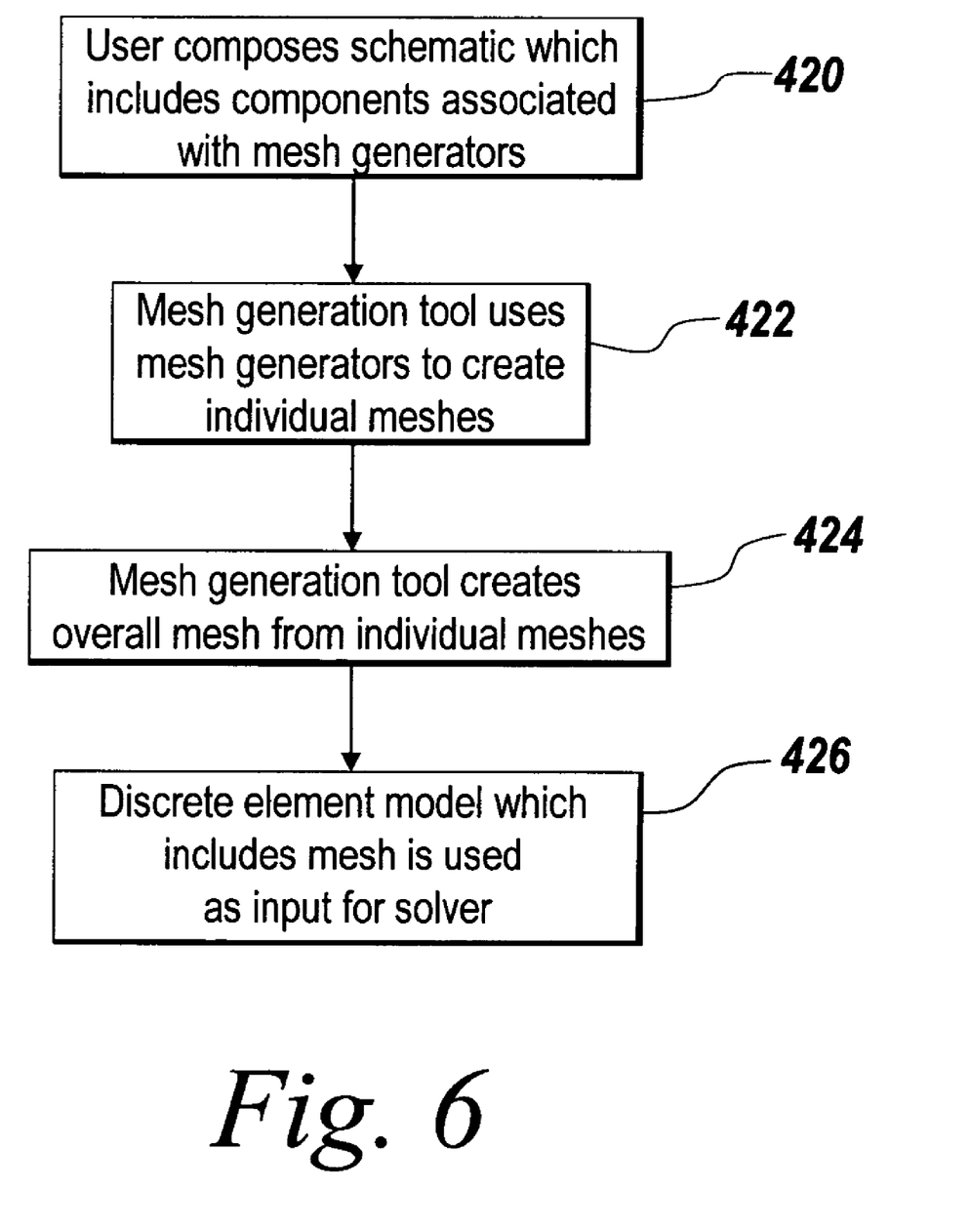
FIG. 6 is a flowchart of the sequence of steps followed by the illustrative embodiment of the present invention to utilize the mesh generated by the mesh generation tool as part of a discrete element model used as input for a numerical PDE solver.

FIG. 6 is a flowchart of the overall sequence of steps followed by the illustrative embodiment of the present invention to programmatically generate a mesh from a user-composed schematic and then use the generated mesh as part of a Discrete Element model being used as input for a numerical solver. The sequence begins when a user composes a schematic which includes components associated with mesh generators (step 420). The mesh generation tool 145 then uses the multiple mesh generators which are each associated with the schematic components to create individual meshes representing those components (step 422). The mesh generation tool 145 then creates an overall mesh from the individual meshes by joining them together (step 424). A discrete element model, which includes the generated mesh, is then fed as input into a numerical solver to verify the assumptions made in creating the schematic (step 426).

Since certain changes may be made without departing from the scope of the present invention, it is intended that all matter contained in the above description or shown in the accompanying drawings be interpreted as illustrative and not in a literal sense. Practitioners of the art will realize that the system configurations depicted and described herein are examples of multiple possible system configurations that fall within the scope of the current invention. Likewise, the sequences of steps discussed herein are examples and not the exclusive sequence of steps possible within the scope of the present invention.

We claim:

1. In a Computer Aided Design (CAD) Environment, a method for automatic mesh generation comprising the steps of:

composing a schematic MEMS(Micro Electro-Mechanical Systems) design suitable for system-level simulations, said MEMS design including a plurality of components, each said component of said plurality of components being associated with a mesh generator, each said mesh generator being computer instructions describing how to create a mesh for the associated component;

providing a mesh generation tool, said mesh generation tool using at least one of said plurality of mesh generators to automaticlly generate at least one mesh that represents at least one of a MEMS device that is the subject of said schematic MEMS design and a user-defined sub-assembly; and using said at least one mesh automatically generated from said schematic MEMS design as input for a numerical PDE (Partial Differential Equation) solver in a simulation environment, said PDE solver verifying approximations made in said system-level simulations of said MEMS design.

2. The method of claim 1 wherein each said component is one of a behavioral model and at least one connection to other components.

3. The method of claim 1 wherein said system-level simulation environment is one of a circuit simulation environment and a signal flow simulation environment.

4. The method of claim 1, wherein the step of generating at least one mesh includes the further steps of:

generating a plurality of individual meshes for said plurality of components in said schematic MEMS design;

analyzing said schematic MEMS design to determine connections between a plurality of components in said schematic MEMS design; and connecting said plurality of individual meshes into a single mesh based on said determined connections.

5. The method of claim 4, comprising the further step of:

adjusting programmatically a mesh density of each of said individual meshes based upon a programmatic analysis of said schematic MEMS design.

6. The method claim 4, comprising the further step of:

adjusting a mesh density of each of said individual meshes based upon an analysis of said schematic MEMS design.

7. The method of claim 4, comprising the further step of:

selecting an element type for an individual mesh based upon a programmatic analysis of said schematic MEMS design.

8. The method of claim 4, comprising the further step of:

selecting an element type for an individual mesh based upon an analysis of said schematic MEMS design.

9. The method of claim 1 wherein said PDE solver also receives at least one of boundary conditions and initial conditions as constraints based on programmatic analysis of said schematic design.

10. The method of claim 1, comprising the further step of:

providing a component library in said CAD environment, said component library holding a behavioral model for each component of said schematic MEMS design, said behavioral model being a mathematical description of said component.

11. The method of claim 1 wherein said PDE solver is used to obtain 3D simulation results for at least one of mechanical, electrostatic, magnetic, thermal, electrothermal, piezoelectric, piezo-resistive, fluid damping and electromagnetic effects.

12. The method of claim 1 wherein said generated mesh is at least one of a finite element method (FEM) mesh, boundary element method (BEM) mesh and hybrid FEM/BEM mesh.

13. In a design environment, a method for automatic mesh generation comprising the steps of:

composing a schematic design suitable for system-level simulations, said design including a plurality of components, each said component of said plurality of components being associated with a mesh generator, each said mesh generator being computer instructions describing how to create a mesh for the associated component;

providing a mesh generation tool, said mesh generation tool using at least one said plurality of mesh generators to automatically generate at least one mesh that represents at least one of a device that is the subject of said schematic design and a user-defined sub-assembly; and using said at least one mesh automatically generated from said schematic design as input for a numerical solver in a simulation environment, said solver verifying approximations made in said system-level simulations of said schematic design.

14. The method of claim 13 wherein each said component is one of a behavioral model and one or more connections to other components.

15. The method of claim 13 wherein said system-level simulation environment is one of a circuit simulation environment and a signal flow simulation environment.

16. The method of claim 13, wherein the step of generating said mesh includes the further steps of:

generating a plurality of individual meshes for said plurality of components in said schematic design;

analyzing said schematic design to determine connections between a plurality of components in said schematic design; and connecting said plurality of individual meshes into a single mesh based on said determined connections.

17. The method of claim 16, comprising the further step of:

adjusting programmatically a mesh density of each of said individual meshes based upon a programmatic analysis of said schematic design.

18. The method of claim 16, comprising the further step of:

adjusting a mesh density of each of said individual meshes based upon an analysis of said schematic design.

19. The method of claim 16, comprising the further step of:

selecting an element type for an individual mesh based upon a programmatic analysis of said schematic design.

20. The method of claim 16, comprising the further step of:

selecting an element type for an individual mesh based upon an analysis of said schematic design.

21. The method of claim 13, comprising the further step of:

providing a component library in said design environment, said component library holding a behavioral model for each component of said schematic design, said behavioral model being a mathematical description of said component.

22. The method of claim 13 wherein said numerical solver also receives at least one of boundary conditions and initial conditions as constraints based on programmatic analysis of said schematic design.

23. The method of claim 13 wherein said generated mesh is at least one of a finite element method (FEM) mesh, boundary element method (BEM) mesh and hybrid mesh.

24. In a Computer Aided Design (CAD) Environment, a method for automatic mesh generation comprising the steps of:

providing a schematic MEMS(Micro Electro-Mechanical Systems) design suitable for system-level simulation, said MEMS design including a plurality of components, each said component of said plurality of components being associated with a mesh generator, each said mesh generator being computer instructions describing how to create at least one of a finite element method (FEM) mesh, boundary element method (BEM) mesh and hybrid mesh for the associated element;

providing a mesh generation tool, said mesh generation tool using at least one of said plurality of mesh generators to automatically generate at least one of a FEM mesh, BEM mesh and hybrid mesh that represents at least one of a MEMS device that is the subject of said schematic MEMS design and a user-defined sub-assembly; and using at least one of said FEM mesh, said BEM mesh and said hybrid mesh automatically generated from said schematic MEMS design as input for a numerical PDE (Partial Differential Equation) solver in a simulation environment, said PDE solver verifying approximations made in said system-level simulations of said MEMS design.

25. The method of claim 24, wherein the step of generating at least one of said FEM mesh, said BEM mesh and said hybrid mesh includes the further steps of:
generating a plurality of individual meshes for said plurality of components in said schematic MEMS design;
analyzing said schematic MEMS design to determine connections between a plurality of components in said schematic MEMS design; and
connecting said plurality of individual meshes into a single mesh based on said determined connections.

26. The method of claim 25, comprising the further step of:
adjusting programmatically a mesh density of each of said individual meshes based upon a programmatic analysis of said schematic MEMS design.

27. The method of claim 25, comprising the further step of:
selecting an element type for an individual mesh based upon a programmatic analysis of said schematic MEMS design.

28. In a Computer Aided Design (CAD) Environment, a medium holding computer-executable steps for a method, said method comprising the steps of:
composing a schematic MEMS(Micro Electro-Mechanical Systems) design suitable for system-level simulations, said MEMS design including a plurality of components, each said component of said plurality of components being associated with a mesh generator, each said mesh generator being computer instructions describing how to create a mesh for the associated component;
providing a mesh generation tool, said mesh generation tool using at least one of said plurality of mesh generators to automatically generate at least one mesh that represents at least one of a MEMS device that is the subject of said schematic MEMS design and a user-defined sub-assembly; and
using said at least one mesh automatically generated from said schematic MEMS design as input for a numerical PDE (Partial Differential Equation) solver in a simulation environment, said PDE solver verifying approximations made in said system-level simulations of said MEMS design.

29. The medium of claim 28 wherein each said component is one of a behavioral model and at least one connection to other components.

30. The medium of claim 28 wherein said system-level simulation environment is one of a circuit simulation environment and a signal flow simulation environment.

31. The medium of claim 28 wherein the step of generating at least one mesh includes the further steps of:
generating a plurality of individual meshes for said plurality of components in said schematic MEMS design;
analyzing said schematic MEMS design to determine connections between a plurality of components in said schematic MEMS design; and
connecting said plurality of individual meshes into a single mesh based on said determined connections.

32. The medium of claim 31 wherein said method comprises the further step of:
adjusting programmatically a mesh density of each of said individual meshes based upon a programmatic analysis of said schematic MEMS design.

33. The medium of claim 31 wherein said method comprises the further step of:
adjusting a mesh density of each of said individual meshes based upon an analysis of said schematic MEMS design.

34. The medium of claim 31 wherein said method comprises the further step of:
selecting an element type for an individual mesh based upon a programmatic analysis of said schematic MEMS design.

35. The medium of claim 31 wherein said method comprises the further step of:
selecting an element type for an individual mesh based upon an analysis of said schematic MEMS design.

36. The medium of claim 28 wherein said numerical solver also receives at least one of boundary conditions and initial conditions as constraints based on programmatic analysis of said schematic design.

37. The medium of claim 28 wherein said method comprises the further step of:
providing a component library in said CAD environment, said component library holding a behavioral model for each component of said schematic MEMS design, said behavioral model being a mathematical description of said component.

38. The medium of claim 28 wherein said PDE solver is used to obtain 3D simulation results for at least one of mechanical, electrostatic, magnetic, thermal, electrothermal, piezoelectric, piezo-resistive, fluid damping and electromagnetic effects.

39. The medium of claim 28 wherein said method comprises the further step of:
using said schematic MEMS design as the basis for a 3D model displayed to a user of said CAD environment.

40. The medium of claim 28 wherein said generated mesh is at least one of a finite element method (FEM) mesh, boundary element method (BEM) mesh and hybrid mesh.

41. In a Computer Aided Design (CAD) Environment, a medium holding computer-executable steps for a method, said method comprising the steps of:
providing a schematic MEMS(Micro Electro-Mechanical Systems) design suitable for system-level simulation, said MEMS design including a plurality of components, each said component of said plurality of components being associated with a mesh generator, each said mesh generator being computer instructions describing how to create at least one of a finite element method (FEM) mesh, boundary element method (BEM) mesh and hybrid mesh for the associated element;
providing a mesh generation tool, said mesh generation tool using at least one of said plurality of mesh generators to automatically generate at least one of a FEM mesh, BEM mesh and hybrid mesh that represents at least one of a MEMS device that is the subject of said schematic MEMS design and a user-defined sub-assembly; and
using said at least one of said FEM mesh, said BEM mesh and said hybrid mesh automatically generated from said schematic MEMS design as input for a numerical PDE (Partial Differential Equation) solver in a simulation environment, said PDE solver verifying approximations made in said system-level simulations of said MEMS design.

42. In a design environment, a medium holding computer-executable steps for a method, said method comprising the steps of:
composing a schematic design suitable for system-level simulations, said design including a plurality of components, each said component of said plurality of components being associated with a mesh generator, each said mesh generator being computer instructions describing how to create a mesh for the associated component;

providing a mesh generation tool, said mesh generation tool using at least one of said plurality of mesh generators to automatically generate at least one mesh that represents at least one of a device that is the subject of said schematic design and a user-defined sub-assembly; and using said at least one mesh automatically generated from said schematic design as input for a numerical solver in a simulation environment, said solver verifying approximations made in said system-level simulations of said schematic design.

43. The medium of claim 42 wherein each said component is one of a behavioral model and one or more connections to other components.

44. The medium of claim 42 wherein said system-level simulation environment is one of a circuit simulation environment and a signal flow simulation environment.

45. The medium of claim 42 wherein the step of generating said mesh includes the further steps of:
generating a plurality of individual meshes for said plurality of components in said schematic design;
analyzing said schematic design to determine connections between a plurality of components in said schematic design; and
connecting said plurality of individual meshes into a single mesh based on said determined connections.

46. The medium of claim 45 wherein said method comprises the further step of:
adjusting programmatically a mesh density of each of said individual meshes based upon a programmatic analysis of said schematic design.

47. The medium of claim 45 wherein said method comprises the further step of:
adjusting a mesh density of each of said individual meshes based upon an analysis of said schematic design.

48. The medium of claim 45 wherein said method comprises the further step of:
selecting an element type for an individual mesh based upon a programmatic analysis of said schematic design.

49. The medium of claim 45 wherein said method comprises the further step of:
selecting an element type for an individual mesh based upon an analysis of said schematic design.

50. The medium of claim 42 wherein said method comprises the further step of:
providing a component library in said design environment, said component library holding a behavioral model for each component of said schematic design, said behavioral model being a mathematical description of said component.

51. The medium of claim 42 wherein said numerical solver also receives at least one of boundary conditions and initial conditions as constraints based on programmatic analysis of said schematic design.

52. The medium of claim 42 wherein said generated mesh is at least one of a finite element method (FEM) mesh, boundary element method (BEM) mesh and hybrid mesh.

53. In a CAD environment, a system comprising:
a schematic MEMS design suitable for system-level simulations, said schematic MEMS design including a plurality of components, each said component being associated with a mesh generator, said mesh generator being a set of computer instructions describing how to create a mesh for the associated component;
a mesh generation tool, said mesh generation tool using said plurality of mesh generators to generate at least one mesh that represents at least one of a MEMS device that is the subject of said schematic MEMS design and a user-defined sub-assembly; and
a numerical PDE solver, said numerical PDE solver using said at least one mesh automatically generated as input to verify approximations made in system-level simulations of the schematic MEMS design.

54. The system of claim 53 wherein said generated mesh is at least one of a finite element method (FEM) mesh, boundary element method (BEM) mesh and hybrid mesh.

55. The system of claim 53 wherein each said component is one of a behavioral model and at least one connection to other components.

56. The system of claim 53 wherein said system-level simulation is one of a circuit simulation and a signal flow simulation.

57. The system of claim 53 wherein a plurality of individual meshes is generated for said plurality of components in said schematic MEMS design.

58. The system of claim 57 wherein said schematic MEMS design is analyzed to determine connections between said plurality of components in said schematic MEMS design.

59. The system of claim 58 wherein said plurality of individual meshes are connected into a single mesh based on said determined connections.

* * * * *